United States Patent [19]

Kuroda et al.

[11] Patent Number: 4,814,838
[45] Date of Patent: Mar. 21, 1989

[54] SEMICONDUCTOR DEVICE AND METHOD OF MANUFACTURING THE SAME

[75] Inventors: Takao Kuroda; Akiyoshi Watanabe, both of Koganei; Takao Miyazaki, Hachioji; Hiroyoshi Matsumura, Saitama, all of Japan

[73] Assignee: Hitachi, Ltd., Tokyo, Japan

[21] Appl. No.: 56,657

[22] Filed: Jun. 2, 1987

[30] Foreign Application Priority Data

Jun. 2, 1986 [JP] Japan .................. 61-125736

[51] Int. Cl.$^4$ ............................ H01L 29/80
[52] U.S. Cl. ........................ 357/22; 357/60; 357/88; 357/16
[58] Field of Search ............. 357/60, 88, 22 I, 22 A, 357/16

[56] References Cited

U.S. PATENT DOCUMENTS

| | | | |
|---|---|---|---|
| 3,953,876 | 3/1976 | Sirtl | 357/88 |
| 4,062,038 | 12/1977 | Cuomo | 357/88 |
| 4,632,712 | 12/1986 | Fan | 357/60 |

Primary Examiner—Martin H. Edlow
Attorney, Agent, or Firm—Antonelli, Terry & Wands

[57] ABSTRACT

A semiconductor device in which two sorts of compound semiconductors having unequal lattice constants are joined, is disclosed.

Defects such as dislocations attributed to lattice mismatching are avoided by subjecting one of the compound semiconductors to atomic layer doping with an impurity. Owing to this construction, it is permitted to combine the optimum materials as the compound semiconductors, and the semiconductor device has its performance improved and its design versatility expanded.

9 Claims, 2 Drawing Sheets

SEMICONDUCTOR DEVICE AND METHOD OF MANUFACTURING THE SAME

BACKGROUND OF THE INVENTION (A) Field of the Invention:

The present invention relates to a semiconductor device having a Schottky junction, and a method of manufacturing the same. More particularly, it relates to a semiconductor device wherein a material of higher Schottky barrier is formed on a material of lower Schottky barrier as a heterojunction, the boundary dislocations of which are passivated to reduce a leakage current, and also to a method of manufacturing the semiconductor device.

(B) Description of the Prior Art: $In_xGa_{1-x}As_yP_{1-y}$ mixed crystals which are lattice-matched to InP substrates, especially (InGa)As ternary mixed crystlls, exhibit as high mobilities as 8000 cm$^2$/V-sec at the room temperature and are expected as materials for high-speed FET's. In this regard, since a favorable Schottky junction cannot be formed, a method has been employed wherein lattice-matched (InAl)As is grown on the surface of the mixed crystal so as to form a Schottkyjunction on the grown layer (refer to FIG. 2, and H. Ohno et al: IEEE, Electron Device Lett. Vol. EDL-1, p. 154, 1980).

The material InAlAs, however, has the two disadvantages that it is very prone to oxidation because the mol ratio of AlAs is 0.5, and that it exhibits a Schottky barrier of 0.6 V which is not very high.

On the other hand, there has recently been experimentally fabricated an FET as shown in FIG. 3 wherein a thin film of GaAs having a lattice constant greatly different from that of an InP substrate is grown on InGaAs. In this case, however, a thick film of or above approximately 400 Å cannot afford a good surface because of a lattice mismatching which is as great as 4%. Moreover, since dislocation networks at a very high density are existent at the boundary, the leakage current flows through the dislocations, and characteristics satisfactory for the gate electrode of an FET have not been obtained (refer to C. Y. Chen at al: Appl. Phys. Lett., Vol. 46 (1985), p. 1145, and C. Y. Chen et al: IEEE, Electron Device Lett., Vol. EDL-6 (1985), p. 20).

The stabilities of devices and the enhanced characteristics thereof are not considered in the prior arts, either.

SUMMARY OF THE INVENTION

The present invention solves the problems of the prior arts mentioned above, by adopting a construction in which a first compound semiconductor and a second compound semiconductor having unequal lattice constants are formed, the second compound semiconductor has a structure of at least two layers, and at least one layer sandwiched between the two layers is an adsorption layer for impurity atoms.

More specifically, an object of the present invention is to solve the problems of the arts and to provide a semiconductor device in which the leakage current of a gate is remarkably reduced by employihg a material of great Schottky barrier, as well as a method of manufacturing the semiconductor device.

Another object of the present invention is to provide a semiconductor device which has a certain tolerance for the lattice matching of semiconductor layers, as well as a method of manufacturing the semiconductor device, thereby to widely expand the range of selection of materials.

Still another object of the present invention is to provide a semiconductor device which has great merits for the fabrication thereof, particularly which has a very small number of defects, as well as a method of manufacturing the semiconductor device.

Still another object of the present invention is to provide a semiconductor device which operates stably and whose characteristics are remarkably enhanced, as well as a method of manufacturing the semiconductor device.

With those and other objects in view, the invention consists in the methods and the construction hereinafter fully described, illustrated in the accompanying drawings, and set forth in the claims hereto appended, it being understood that various changes in the operation, form, proportion and minor details of construction, within the scope of the inventive idea of the present invention, may be resorted to without departing from the spirit of the invention or sacrificing any of the advantages thereof.

BRIEF DESCRIPTION OF THE DRAWING

FIG. 4(a) is a model diagram showing an energy band structure in the case of atomic layer doping with an appropriate amount of impurity, while

DETAILED DESCRIPTION OF THE INVENTION

Figure 1:
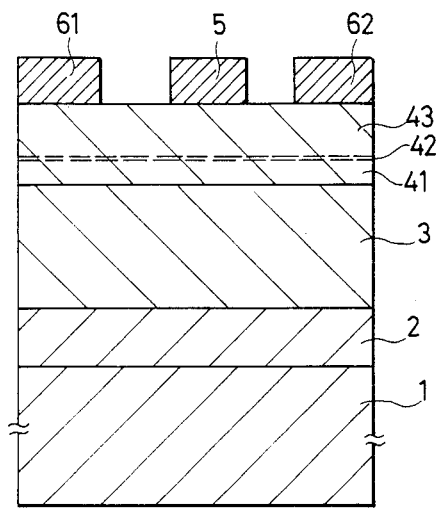
FIG. 1 is a diagram showing an example of an FET with a structure in which boundary locations are passivated owing to a strained cap layer formed by atomic layer doping with a donor element according to the present invention.

The structure of a semiconductor device according to the present invention will be described with reference to FIG. 1. In the example of FIG. 1, on an InGaAs layer 3, GaAs 41 is first grown to a thickness of 50 Å–300 Å, and the growth is once suspended. A donor impurity 42 such as Si is adsorbed on the grown surface. Thereafter, the growth of GaAs 43 is started again, and it is stopped at a thickness of at most about 600 Å being the limit at which the surface morphology of a film deteriorates, preferably at a thickness of about 400 Å. With this structure, on account of the lattice mismatching between InGaAs and GaAs, dislocation networks at a high density appear already within the first GaAs grown layer 41 of 50–300 Å. As regards the dislocation networks, the impurity such as Si is adsorbed or gettered selectively around dislocations, and the donor neutralizes the charge of a dislocation core acting ordinarily as an acceptor. Thus, a local band bending formed within the grown layer is remedied, and this functions in the direction of lowering a leakage current.

Figure 5A:
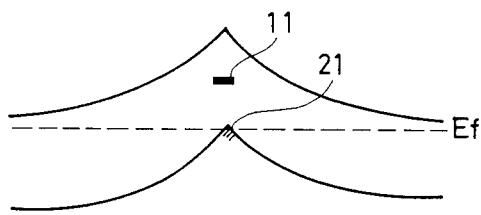
FIGS. 5(a) and 5(b) are model diagrams for explaining the effect of the passivation of dislocations.
Figure 5B:
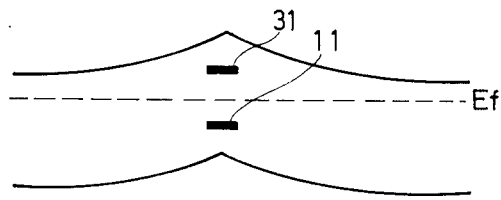

The principle of the above operation will be elucidated with reference to FIGS. 5(a) and 5(b). These figures illustrate in model-like fashion the band gaps of GaAs in the case where the dislocations have developed.

FIG. 5(a) depicts the state in which the energy band of GaAs is bent by a defect level ascribable to the dislocation, so that current becomes easy of flowing along the dislocation, namely, perpendicularly to the sheet of the drawing. In FIG. 5(a), numeral 11 indicates a deep acceptor level induced by the defect such as dislocation, and numeral 21 indicates holes accumulated by the bending of the energy band in the vicinity of the dislocation. A broken line in the figure denotes the Fermi level $E_f$. In this manner, the defect level attributed to the dislocation or the like distorts the energy band of GaAs, with the result that the leakage current rises.

FIG. 5(b) depicts the band gap of GaAs in the semiconductor device according to the present invention. As in the case of FIG. 5(a), numeral 11 indicates a deep acceptor level caused by the defect such as dislocation. In FIG. 5(b), however, the energy band of GaAs is not distorted so much as in FIG. 5(a). The reason therefor is that, since the GaAs layer is doped with the impurity such as Si, a donor level 31 based on the doping is formed. That is, the growth of GaAs is suspended, and the impurity such as Si is adsorbed to the dislocation by the doping, whereby the charge neutralization takes place, and the bending of the band is suppressed. In this example, accordingly, no hole is accumulated, and the leakage current decreases remarkably.

Although, in the above description, only Si has been referred to as the donor impurity, it is also possible to apply another group-IV element, for example, Ge or C. Besides, in a case where an impurity as an acceptor is required, a group-VI element such as S, Se or Te can be used. Further, it is needless to say that other atoms are also applicable to some sorts of semiconductors.

Figure 2:
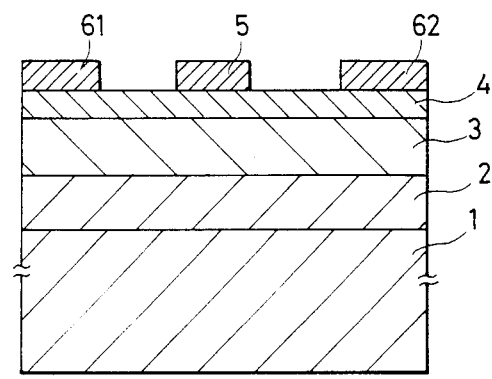
FIG. 2 is a diagram showing a prior-art example of an FET in which a cap layer is made of InAlAs.
Figure 3:
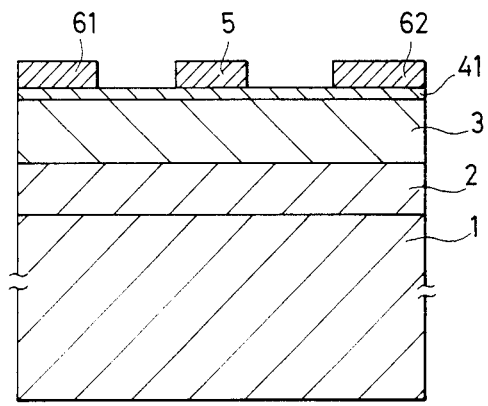
FIG. 3 is a diagram showing a prior-art example of an FET in which a strained cap layer is made of GaAs.

As to the grown film, only GaAs (the Schottky barrier height of which is about 0.8 eV) has been referred to, but $Al_zGa_{1-z}As$ of still higher Schottky barrier may well be employed. Under a condition of $0<z<0.5$, the barrier height can be increased continuously from 0.8 eV to 1.2 eV. In this connection, when the mol ratio of AlAs exceeds 0.7, the surface oxidation is liable to occur as in the case of InAlAs in FIG. 2. Therefore, a mixing ratio of $0<z<0.5$ or so is more desirable in view of processes for the prevention of the oxidation, etc. and also in view of the reliability of the device.

For the grown film, it is also possible to employ a material affording a still larger difference of lattice constants, for example, GaAsP, InGaP or InAlP.

A method of doping in which, after the suspension of the growth of the film, the impurity is adsorbed or ion-implanted into the grown surface, whereupon the impurity is buried by the regrowth, shall be called the "atomic layer doping" here.

In the present invention, it is a prominent feature that the method of the atomic layer doping does not work as one of mere doping methods, but that it works as passivation for inactivating the high-density dislocation networks existent in the subbing film. The suspension of the growth need not always be performed once, but the repetition thereof at every growth of about 100 Å is more effective. However, when the impurity concentration becomes too high, the apparent height of the Schottky barrier decreases due to the doping effect, and hence, it is more advantageous to form the thickest possible undoped region on the Schottky electrode side.

This principle will be described with reference to FIGS. 4(a) and 4(b). These figures are model diagrams for elucidating the increase of the leakage current in the case where the impurity doping is excessive.

Figure 4A:
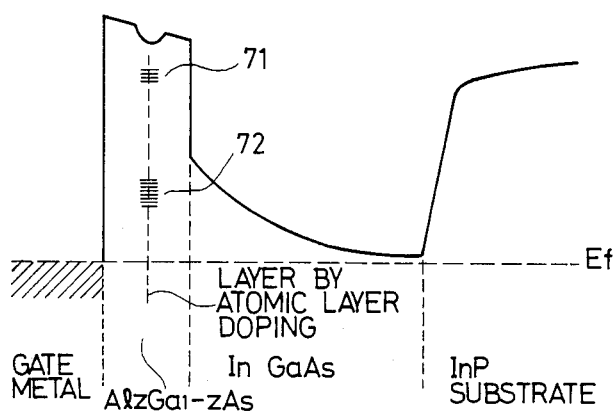

FIG. 4(a) depicts the energy band structure of the semiconductor device in the case where an appropriate amount of impurity has been introduced by the atomic layer doping. In FIG. 4(a), numeral 72 indicates a deep level caused by the dislocation or the like defect. As illustrated in FIGS. 5(a) and 5(b), the impurity is introduced by the doping in order to reduce the distortion of the band attributed to the deep level. Numeral 71 indicates the donor level of the impurity. In this example, the impurity doping does not appreciably affect the height of the Schottky barrier and poses no problem.

Figure 4B:
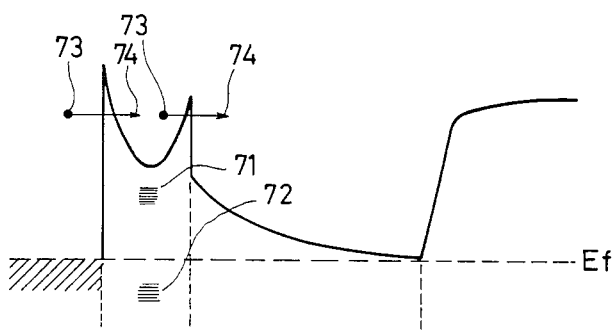
FIG. 4(b) is a model diagram of an energy band structure for explaining the increase of a leakage current in the case where atomic layer doping with an impurity element is excessive.

On the other hand, FIG. 4(b) depicts the energy band structure in the case where the amount of the atomic layer doping with the impurity is excessive. Under the influence of a donor level 71 ascribable to the impurity, the band of a strained cap layer is greatly bent downwards, and tunnel currents 74 based on carriers (electrons) 73 increase to cause the leakage current. This is because the shape of a potential becomes triangular, so the thickness of the barrier, in effect, decreases. For avoiding this drawback, it is more preferable that the undoped region is thickened to the utmost on the Schottky electrode side.

Now, examples of the present invention will be described with reference to FIG. 1. A semi-insulating Fe-doped InP substrate 1 was etched with Br-methanol and sulfuric acid:hydrogen peroxide:water=4:1:1 (volumetric ratio). Thereafter, using an MOCVD method (metal-organic chemical vapor deposition method) at a growth temperature of 640° C., an undoped InP buffer layer 2 was grown about 3000 Å, an n-doped InGaAs layer (n being on the order of $1\times10^{17}$ cm$^{-3}$) 3 was grown 1500 Å, and undoped GaAs 41 was grown 100 Å. Here, the growth was suspended. While arsine (AsH$_3$) was kept flowing, Si was supplied in the form of disilane (Si$_2$H$_6$) and was caused to flow at such a rate that an Si layer 42 of at most uniatomic layer was adsorbed to the surface of the undoped GaAs 41. Subsequently, GaAs 43 was grown again until the whole GaAs became about 400 Å thick. Thereafter, using conventional processes for fabricating an FET, a source 61 and a drain 62 were formed by ohmic contact electrodes of AnGe/Ni/An, and a gate 5 was formed by a Schottky electrode of Al/Ti. The static characteristics of the FET thus manufactured were measured. For comparison's sake, n-GaAs (n being on the order of $1\times10^{17}$ cm$^{-3}$ and being about 1500 Å) was grown on semi-insulating GaAs by MOCVD, and an FET was manufactured by quite the same processes. Then, as regards the leakage current of the gate, both the FET's attained substantially the same performances, and it was revealed that the InGaAs-based MESFET equivalent to the MESFET of GaAs can be produced according to the method of the present invention.

The growth was carried out with the growth temperature lowered from 640° C. to 600° C. and 550° C., to form devices of the structure in FIG. 1, and the characteristics of the devices were compared. Then, at the lower growth temperature, the FET was better with the leakage current of the gate reduced.

Besides, as to a sample grown as in FIG. 1 by MBE (molecular beam epitaxy), favorable FET characteristics with a reduced leakage current were attained. In this case, even when InAlAs lattice-matched with InP was used for the buffer layer instead of InP, similar favorable characteristics were attained.

Moreover, similar characteristics were obtained even when a large number of semiconductor layers each consisting of thin layers 41, 42 and 43 were stacked.

Furthermore, in a case where GaAs was replaced with $Al_zGa_{1-z}As$ ($0<z<0.5$), the tendency of of the leakage current corresponding to raise in the Schottky barrier height was noted.

The above has been the case of forming the Schottky junction for InGaAs. In general, however, the method of the present invention is similarly applicable to any desired case where a material of higher Schottky barrier such as GaAs is grown to be very thin on a material of lower Schottky barrier, for example, InP, InAs, or InSb(InGa)(AsP).

Also as to the FET made of GaAs, significant merits such as reduction in the gate current are attained in a case where a material of higher Schottky barrier such as InGaP or GaAsP is further grown to be very thin on the GaAs layer itself.

The ion implantation of Si was also effective as an impurity adsorption method in the case of the growth by MBE. On this occasion, the growth was suspended, the ions were implanted shallow (several hundred Å) in the surface of the grown layer, and the growth was thereafer restarted.

According to the examples stated above, the operating layer of a device and a material for forming a Schottky junction need not always be lattice-matched therebetween. In consequence, the combination of optimum materials can be used in each case, and enhancement in performance and expansion in the versatility of design are bestowed on an FET and other general devices employing Schottky junctions. Besides, the idea that defects such as dislocations generated at a high density in a hetero-boundary are passivated by the electron layer doping based on impurity adsorption, is important from the viewpoint of improving the reliability of the device.

It is to be understood that the practicable aspects of performance or embodiments mentioned in the foregoing detailed description of the invention are intended to clarify the technical contents of the invention to the last, and that the present invention shall not be narrowly construed as being restricted to such practicable examples only. Various changes may be resorted to within the spirit of the invention and the scope defined in the claims.

What is claimed is:

1. A semiconductor device comprising:
    a first compound semiconductor which has a first lattice constant,
    a second compound semiconductor which is formed on said first compound semiconductor and which has a lattice constant unequal to the first lattice constant, said second compound semiconductor being formed of at least two layers, and
    at least one layer of impurity atom adsorption which is interposed between the adjacent layers of said second compound semiconductor.

2. A semiconductor device as claimed in claim 1, wherein said first compound semiconductor is a quaternary mixed crystal expressed by $(In_xGa_{1-x})(As_yP_{1-y})$ ($0 \leq x, y \leq 1$), and said second compound semiconductor is a ternary mixed crystal expressed by $(Ga_{1-z}Al_z)As$ ($0 \leq z \leq 0.7$).

3. A semiconductor device as claimed in claim 1, wherein the impurity atom layer contains Si as an impurity.

4. A semiconductor device as claimed in claim 1, wherein that one of the plurality of layers of said second compound semiconductor which is most remote from said first compound semiconductor has a thickness of at most 600 Å, and each of the others of said plurality of layers has a thickness of 50 to 300 Å.

5. A semiconductor device as claimed in claim 1, wherein said first compound semiconductor is (InGa)As.

6. A semiconductor device as claimed in claim 1, wherein said second compound semiconductor is GaAs.

7. A semiconductor device as claimed in claim 1, wherein said second compound semiconductor is $Ga_{1-z}Al_zAs$ ($0 \leq z \leq 0.7$).

8. The device as set forth in claim 1, wherein the layer of impurity atom adsorption is formed by adsorbing impurity atoms to an upper surface of one of the layers of the second compound semiconductor.

9. A semiconductor device comprising:
    a first compound semiconductor which has a first lattice constant, a second compound semiconductor which is formed on the first compound semiconductor and which has a second lattice constant unequal to the first lattice constant; and a layer of impurity atom adsorption in the second compound semiconductor, wherein the layer of impurity atom adsorption is formed by impurity atoms which are adsorbed in disclocations in the second compound semiconductor so as to suppress bending of the energy band of the second compound semiconductor.

* * * * *